US006452520B1

(12) United States Patent
Smith et al.

(10) Patent No.: US 6,452,520 B1
(45) Date of Patent: Sep. 17, 2002

(54) GATED COUNTER ANALOG-TO-DIGITAL CONVERTER WITH ERROR CORRECTION

(75) Inventors: Andrew D. Smith, Redondo Beach; Quentin P. Herr, Torrance; Mark W. Johnson, La Canada Flintridge; Bruce J. Dalrymple, Redondo Beach, all of CA (US)

(73) Assignee: TRW Inc., Redondo Beach, CA (US)

( * ) Notice: Subject to any disclaimer, the term of this patent is extended or adjusted under 35 U.S.C. 154(b) by 0 days.

(21) Appl. No.: 09/725,620

(22) Filed: Nov. 29, 2000

(51) Int. Cl.[7] .............................................. H03M 1/00
(52) U.S. Cl. ....................................... 341/133; 341/171
(58) Field of Search ........................ 341/133, 94, 143, 341/171, 118, 120; 340/347

(56) References Cited

U.S. PATENT DOCUMENTS

| | | | |
|---|---|---|---|
| 4,646,060 A | 2/1987 | Phillips et al. | ............... 340/347 |
| 4,922,250 A | 5/1990 | Phillips et al. | ............... 341/133 |
| 5,012,243 A | 4/1991 | Lee | ............... 341/133 |
| 5,019,818 A | 5/1991 | Lee | ............... 341/133 |
| 5,327,130 A | * 7/1994 | Kang et al. | ................. 341/133 |
| 5,469,057 A | * 11/1995 | Robinson | .................... 324/248 |
| 5,942,997 A | * 8/1999 | Silver et al. | ................. 341/133 |
| 6,225,936 B1 | * 5/2001 | Silver et al. | ................. 341/157 |
| 6,313,769 B1 | * 11/2001 | Mangahas et al. | ........... 341/118 |

* cited by examiner

*Primary Examiner*—Peguy JeanPierre
*Assistant Examiner*—Joseph J Lauture
(74) *Attorney, Agent, or Firm*—Harness, Dickey & Pierce, P.L.C.

(57) ABSTRACT

A superconducting A/D converter (10) has an error correction system (70) for eliminating non-linearities in a primary quantizer (30). The converter (10) includes a primary quantizer (30), a primary SFQ counter (50), and the error correction system (70). The primary quantizer (30) generates primary SFQ pulses based on an average voltage of an analog input signal. The primary SFQ counter (50) converts the primary SFQ pulses into a digital output signal based on a frequency of the primary SFQ pulses. The error correction system (70) corrects the digital output signal based on the analog input signal and the primary SFQ pulses. Using the primary SFQ pulses to correct the digital output signal allows the converter (10) to take into account the non-linearities of the primary quantizer (30).

19 Claims, 2 Drawing Sheets

GATED COUNTER ANALOG-TO-DIGITAL CONVERTER WITH ERROR CORRECTION

The U.S. Government has certain rights in this invention pursuant to the clause at FAR 52.227-12.

BACKGROUND OF THE INVENTION

1. Field of the Invention

This invention relates generally to superconducting analog-to-digital converters and, more particularly, to a superconducting analog-to-digital converter having an error correction system for correcting a digital output signal based on non-linearities in a primary quantizer.

2. Discussion of the Related Art

High-performance analog-to-digital (A/D) converters are required in a variety of commercial and military electronic devices. For example, digital mixers rely on accurate front-end digitization of radio frequency signals with high dynamic range, wide bandwidth, and high linearity. Furthermore, in order to detect weak signals in the presence of interference, A/D converters must be able to handle a wide range of signals simultaneously. Systematic non-linearities from an input signal to a digital output signal are particularly troublesome and give rise to harmonics and intermodulation artifacts. Two of the more important measures of an A/D converter's performance are its speed, as measured by the number of samples converted per second, and resolution, as measured by the smallest increment of change that can be detected in an analog input signal.

Numerous superconducting A/D architectures have been proposed and built, including counting type, sigma-delta, and flash designs. In fact, superconducting technology is particularly well suited to performing high-speed, high-resolution A/D conversion largely because of Josephson junctions. Josephson junctions are the basic switching elements utilized in superconducting electronic devices, and possess a unique combination of speed, sensitivity, and periodic response characteristics.

The Josephson junction is a simple switching device having a very thin insulating layer sandwiched between two superconducting electrodes. When current applied to the Josephson junction is increased above the critical current of the junction, the device is switched from a superconducting zero-voltage state to a resistive voltage state. Because this switching operation can occur in as little as a few picoseconds, the Josephson junction is truly a high-speed switching device. In a superconducting A/D converter, one or more of the Josephson junctions are combined with one or more inductive loads to perform a logic circuit.

Counting-type superconducting A/D converters have demonstrated promising results, with excellent bandwidth, resolution, and signal-to-noise ratio (SNR) at high sampling (integration) rates. The total accuracy of counting-type superconducting A/D converters is tallied on a signal-to-noise and distortion (SINAD) ratio. SINAD accounts for both noise effects (SNR) and systematic non-linearities in the A/D conversion. A potential area for improvement in this technology relates to the non-linearities that limit total superconducting A/D performance for large signals.

A typical superconducting A/D converter has a quantizer followed by a single-flux-quantum (SFQ) counter. The quantizer uses Josephson junctions to generate SFQ pulses. The generation rate of SFQ pulses is exactly proportional to the voltage of the analog input signal. The counter counts the number of pulses received over a given time period. The result is a digital output signal representing the average voltage of the analog input signal. Problematic non-linearities are commonly due to the quantizer. Specifically, although fundamental physics dictate that the conversion of voltage to SFQ pulses is perfect (a constant of proportionality of $4.83 \times 10^{+14}$ pulses/volt-second), any non-linearity in the current-voltage transfer characteristic leads to a corresponding non-linearity in the current-pulse behavior of the quantizer.

In fact, experimentally, the assemblage of resistors, inductors, and Josephson junctions making up the quantizer acts somewhat as a non-linear resistor. As already noted, counting with the SFQ counter for a fixed time interval converts the pulse frequency to a digital word representing the average voltage over the time interval. Thus, the non-linearities in the quantizer are reflected at the output of the SFQ counter. In fact, the non-linear current-voltage characteristic of the quantizer also contributes to spurious signal generation in the converted spectrum. It has been shown that a single tone input applied to the A/D converter produces measurable harmonic response at integer multiples of the input frequency. It is therefore desirable to provide a superconducting A/D converter capable of correcting the digital output signal based on the non-linearities of the quantizer.

SUMMARY OF THE INVENTION

In accordance with the teachings of the present invention, a superconducting A/D converter is disclosed. In one embodiment, the converter includes a primary quantizer, a primary SFQ counter, and an error correction system. The primary quantizer generates primary SFQ pulses based on the voltage of an analog input signal. The primary SFQ counter tallies the primary SFQ pulses into a digital output signal based on a frequency of the primary SFQ pulses. The error correction system corrects the digital output signal based on the analog input signal and the primary SFQ pulses. Using the primary SFQ pulses to correct the digital output signal allows the converter to take into account the non-linearities of the primary quantizer. Linearity in the converter will improve overall digital system sensitivities.

Further in accordance with the present invention, a method for converting an analog input signal into a digital output signal is disclosed. The method includes the step of generating primary SFQ pulses based on the voltage of the analog input signal. The primary SFQ pulses are converted into the digital output signal based on a frequency of the primary SFQ pulses. The method further provides for correcting the digital output signal based on the analog input signal and the primary SFQ pulses.

In another aspect of the invention, a method for correcting a digital output signal of a superconducting A/D converter based on an analog input signal and primary SFQ pulses is disclosed. The method includes the step of generating an analog error signal representing a difference between the analog input signal and the primary SFQ pulses. A digital error signal is then generated based on the analog error signal. The method further provides for subtracting the digital error signal from the digital output signal.

Additional objects, features and advantages of the present invention will become apparent from the following description and the appended claims when taken in connection with the accompanying drawings.

DETAILED DESCRIPTION OF THE PREFERRED EMBODIMENTS

The following discussion of the preferred embodiments directed to a superconducting A/D converter is merely exemplary in nature, and is in no way intended to limit the invention or its applications or uses.

Figure 1:
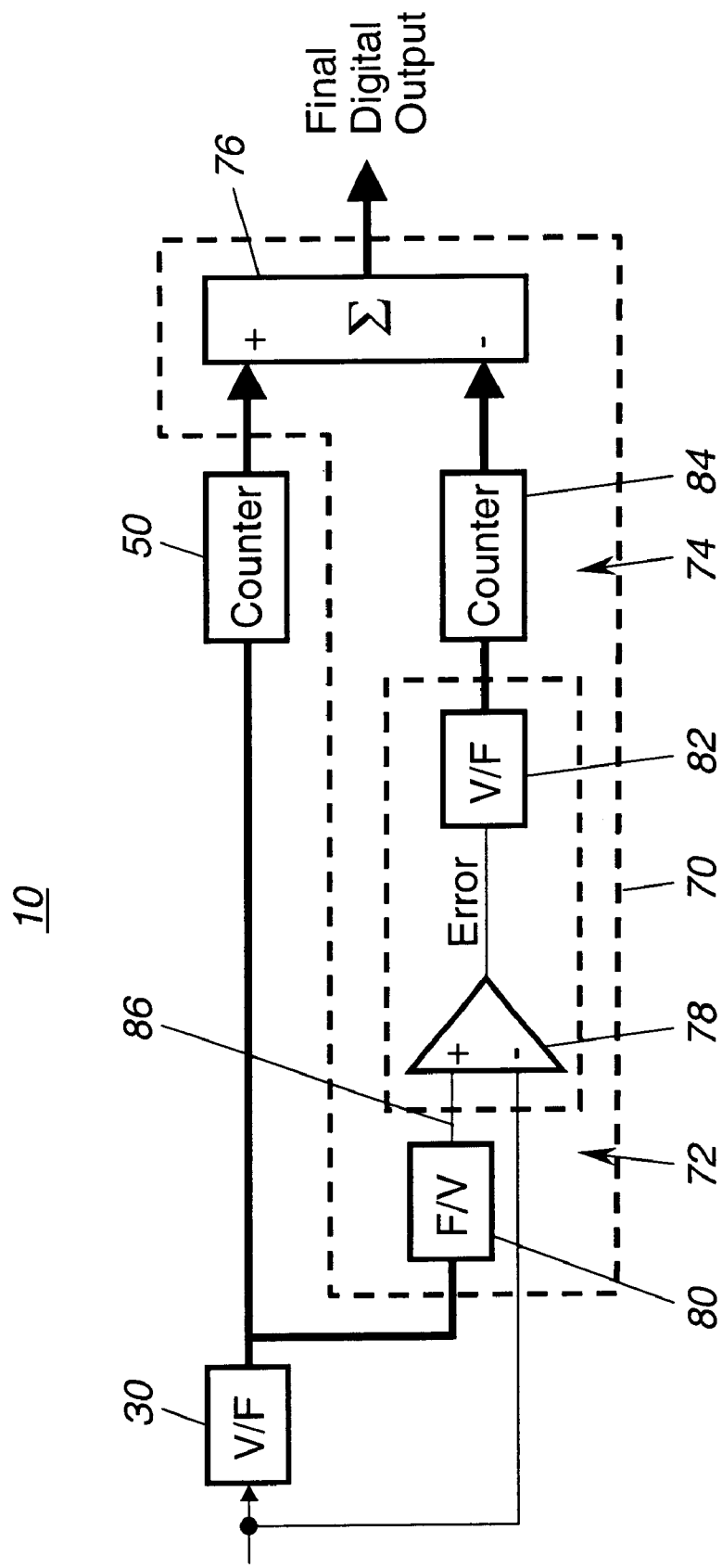
FIG. 1 is a block diagram of a superconducting A/D converter according to the present invention.

Turning now to FIG. 1, a superconducting A/D converter is shown generally at 10. The converter 10 has a primary quantizer 30, a primary SFQ counter 50, and an error correction system 70. The primary quantizer 30 generates primary SFQ pulses based on an instantaneous voltage of the analog input signal. The primary SFQ counter 50 converts the primary SFQ pulses into a digital output signal based on a frequency of the primary SFQ pulses. The error correction system 70 corrects the digital output signal based on the analog input signal and the primary SFQ pulses. Thus, the non-linearities of the primary quantizer 30 are corrected by comparing the quantizer output to that produced by a perfect, purely resistive current pathway.

It is preferred that the error correction system 70 includes an analog signal circuit 72 for generating an analog error signal representing a difference between the analog input signal and the primary SFQ pulses. A digital signal circuit 74 generates a digital error signal based on the analog error signal from the analog signal circuit 72. A summer 76 then subtracts the digital error signal from the digital output signal to obtain an error-corrected digital output signal.

It can be seen that the analog signal circuit 72 preferably includes a frequency to voltage conversion circuit 80 for generating an analog voltage signal based on the frequency of the primary SFQ pulses. As will be discussed below, the frequency to voltage conversion circuit 80 for SFQ pulses can be a simple low pass filter. A comparator 78 compares the analog voltage signal to the original analog input signal and generates the analog error signal based on the comparison. The secondary quantizer 78 generates secondary SFQ pulses based on the instantaneous voltage of the analog error signal. The secondary SFQ counter 84 converts the secondary SFQ pulses into the digital error signal based on the frequency of the secondary SFQ pulses.

Figure 2:
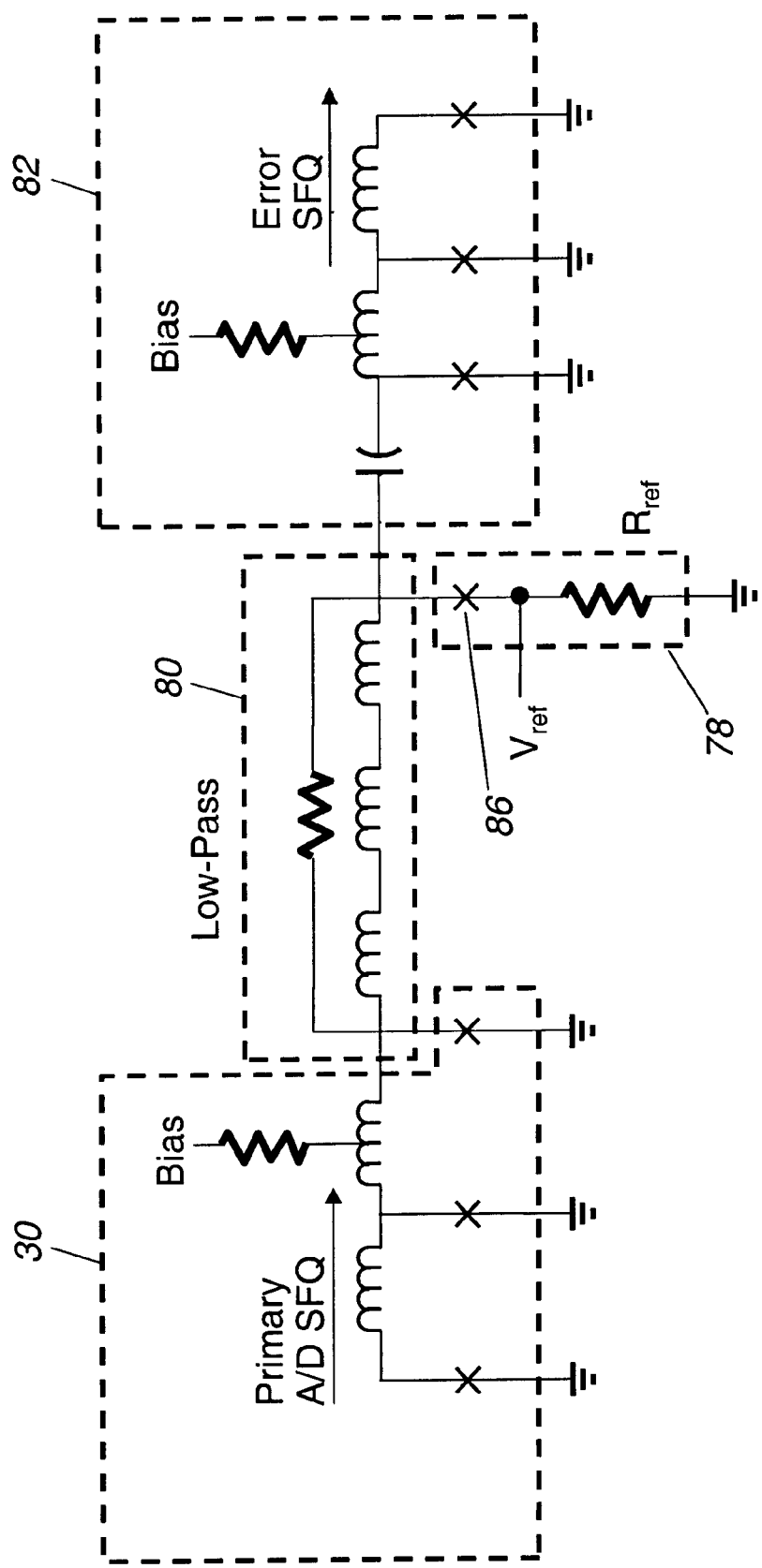
FIG. 2 is a circuit schematic of a frequency to voltage conversion circuit according to one embodiment of the present invention.

Turning now to FIG. 2, it can be seen that the digital SFQ pulses from the primary quantizer 30 reconvert to analog upon passing through a low pass filter in the frequency to voltage conversion circuit 80. The comparator 78 can be achieved via a Josephson junction 86, which responds to the analog error signal of the difference between the analog voltage signal from the low pass filter and the analog input signal ($V_{ref}$). It will be appreciated that the analog signal circuit 72 further includes a standard voltage divider network (not shown) for providing $V_{ref}$ from the input signal.

With continuing reference to FIGS. 1 and 2, it can be seen that in operation the present invention generates primary SFQ pulses based on an instantaneous voltage of the analog input signal. The primary SFQ pulses are converted into the digital output based on a frequency of the primary SFQ pulses. The digital output is corrected based on a comparison of the analog input signal and the primary SFQ pulses. The digital output is corrected by generating an analog error signal representing a difference between the analog input signal and the primary SFQ pulses. As already discussed, the primary SFQ pulses must be converted back to analog before the comparison can be made. A digital error signal is generated based on the analog error signal, and the digital error signal is subtracted from the digital output signal.

It will further be appreciated that a DC offset is preferably added to the analog input signal for proper operation of the Josephson junction 86 in the comparator 78. While the two pathways of the present invention generate SFQ pulses at a rate of approximately 100 Gigabit per second, it may be necessary to correct for slight propagation delays between the primary SFQ pulses and the digital error signal. This can be done by adjusting the apertures of the primary and secondary counters 50, 84 in time. Furthermore, the low pass frequency response and time dispersion of the frequency to voltage conversion circuit 80 may be optimized for the particular A/D application. It can also be appreciated that additional stages of the superconducting A/D converter 10 can be used to further correct for errors. In addition, reactive components can be added to $V_{ref}$ and the primary analog channels to correct for dispersion between the two channels. It is estimated that the enhanced linearity of the present invention can turn existing 40 dB (6-bit) spur-free-dynamic range (SFDR) devices into 96 dB (16 bit) SFDR devices. It is also important to note that the correction system 70 of the present invention would work equally well on superconducting sigma-delta converters.

The foregoing discussion discloses and describes merely exemplary embodiments of the present invention. One skilled in the art will readily recognize from such discussion, and from the accompanying drawings and claims, that various changes, modifications and variations can be made therein without departing from the spirit and scope of the invention as defined in the following claims.

What is claimed is:

1. A method for converting an analog input signal into a digital output signal with a superconducting A/D converter, the method comprising the steps of:

generating primary single-flux-quantum (SFQ) pulses based on an analog input voltage signal;

converting the primary SFQ pulses into the digital output signal based on a frequency of the primary SFQ pulses; and correcting the digital output signal based on the analog input voltage signal and the primary SFQ pulses.

2. The method of claim 1 further including the steps of:

generating an analog error signal representing a difference between the analog input voltage signal and the primary SFQ pulses;

generating a digital error signal based on the analog error signal; and subtracting the digital error signal from the digital output signal.

3. The method of claim 2 wherein the step of generating an analog error signal further comprises converting the primary SQF pulses to an analog voltage signal based on the frequency of the primary SQF pulses.

4. The method of claim 3 further including the steps of:

comparing the analog voltage signal to the analog input voltage signal; and generating the analog error signal based on the comparison.

5. The method of claim 4 further including the step of adding a DC offset to the analog input voltage signal.

6. The method of claim 2 further including the steps of:

generating secondary SFQ pulses based on an instantaneous voltage of the analog error signal; and converting the secondary SFQ pulses into the digital error signal based on a frequency of the secondary SFQ pulses.

7. The method of claim 2 further including the step of correcting for propagation delays between the primary SFQ pulses and the digital error signal.

8. A method for correcting a digital output signal of a superconducting A/D converter based on an analog input voltage signal and primary single-flux-quantum SFQ pulses, the method including the steps of:

generating an analog error signal representing a difference between the analog input voltage signal and the primary (SFQ) signal pulses;

generating a digital error signal based on the analog error signal; and subtracting the digital error signal from the digital output signal.

9. The method of claim 8 wherein the step of generating an analog error signal further comprises converting the primary SFQ pulses to an analog voltage signal based on the frequency of the primary SFQ pulses.

10. The method of claim 9 further including the steps of:

comparing the analog voltage signal to the analog input voltage signal; and generating the analog error signal based on the comparison.

11. The method of claim 10 further including the step of adding a DC offset to the analog input voltage signal.

12. The method of claim 8 further including the steps of:

generating secondary SFQ pulses based on an instantaneous voltage of the analog error signal; and converting the secondary SFQ pulses into the digital error signal based on a frequency of the secondary SFQ pulses.

13. The method of claim 8 further including the step of correcting for propagation delays between the primary SFQ pulses and the digital error signal.

14. A superconducting A/D converter comprising;

a primary quantizer for generating primary single-flux-quantum (SFQ) pulses based on an analog Input voltage signal;

a primary SFQ counter for converting the primary SFQ pulses into a digital output signal based on a frequency of the primary SFQ pulses; and an error correction system for correcting the digital output signal based on the analog input voltage signal and the primary SFQ pulses.

15. The converter of claim 14 wherein the error correction system includes:

an analog signal circuit for generating an analog error signal representing a difference between the analog input voltage signal and the primary SFQ pulses;

a digital signal circuit for generating a digital error signal based on the analog error signal; and a summer for subtracting the digital error signal from the digital output signal.

16. The converter of claim 15 wherein the analog signal circuit includes a low pass filter for generating an analog voltage signal based on the frequency of the primary SFQ pulses.

17. The converter of claim 16 wherein the analog signal circuit further includes a comparator for comparing the analog voltage signal to the analog input voltage signal, the comparator generating the analog error signal based on the comparison.

18. The converter of claim 17 wherein the comparator includes a Josephson junction.

19. The converter of claim 15 wherein the digital signal circuit includes:

a secondary quantizer for generating secondary SFQ pulses based on an average voltage of the analog error signal; and a secondary SFQ counter for converting the secondary SFQ pulses into the digital error signal based on a frequency of the secondary SFQ pulses.

* * * * *